(12) United States Patent
Yang et al.

(10) Patent No.: US 12,062,635 B2
(45) Date of Patent: Aug. 13, 2024

(54) SEMICONDUCTOR DEVICE PACKAGES INCLUDING CONDUCTORS ELECTRICALLY CONNECTING STACKED SEMICONDUCTOR DEVICES BY EXTENDING ALONG SURFACES OF THE SEMICONDUCTOR DEVICES

(71) Applicant: Micron Technology, Inc., Boise, ID (US)

(72) Inventors: Po Chih Yang, Kaohsiung (TW); Yu Jen Chen, Taichung (TW); Po Chen Kuo, Tainan (TW); Shih Wei Liang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/451,693

(22) Filed: Oct. 21, 2021

(65) Prior Publication Data

US 2022/0037282 A1     Feb. 3, 2022

Related U.S. Application Data

(63) Continuation of application No. 16/578,975, filed on Sep. 23, 2019, now Pat. No. 11,171,109.

(51) Int. Cl.
   *H01L 23/12*     (2006.01)
   *H01L 21/56*     (2006.01)
   (Continued)

(52) U.S. Cl.
   CPC ............ *H01L 24/41* (2013.01); *H01L 21/563* (2013.01); *H01L 21/76871* (2013.01);
   (Continued)

(58) Field of Classification Search
   CPC . H01L 24/41; H01L 21/76871; H01L 21/563; H01L 25/0657; H01L 24/09;
   (Continued)

(56) References Cited

U.S. PATENT DOCUMENTS

| | | | |
|---|---|---|---|
| 6,747,348 B2 * | 6/2004 | Jeung | H01L 25/50 257/E21.705 |
| 6,750,547 B2 * | 6/2004 | Jeung | H01L 24/24 385/16 |

(Continued)

FOREIGN PATENT DOCUMENTS

| | | |
|---|---|---|
| TW | 200913208 A | 3/2009 |
| TW | I574332 B | 3/2017 |

OTHER PUBLICATIONS

Taiwanese First Office Action for Application No. 109130871, issued Apr. 8, 2021, 12 pages.

(Continued)

*Primary Examiner* — Ismail A Muse
(74) *Attorney, Agent, or Firm* — TraskBritt

(57) ABSTRACT

Semiconductor device packages may include a first semiconductor device over a substrate and a second semiconductor device over the first semiconductor device. An active surface of the second semiconductor device may face away from the substrate. Conductors may extend from bond pads of the second semiconductor device, along surfaces of the second semiconductor device, first semiconductor device, and substrate to pads of routing members of the substrate. The conductors may be in contact with the bond pads and the routing members and a dielectric material interposed between the conductors and the first semiconductor device and between the conductors and the second semiconductor device. An encapsulant distinct from the dielectric material may cover the conductors, the first semiconductor device, (Continued)

the second semiconductor device, and an upper surface of the substrate. Methods of fabrication are also disclosed.

17 Claims, 6 Drawing Sheets

(51) Int. Cl.
*H01L 21/768* (2006.01)
*H01L 23/00* (2006.01)
*H01L 23/31* (2006.01)
*H01L 25/065* (2023.01)

(52) U.S. Cl.
CPC .......... *H01L 23/3157* (2013.01); *H01L 24/09* (2013.01); *H01L 24/35* (2013.01); *H01L 25/0657* (2013.01)

(58) Field of Classification Search
CPC ................ H01L 24/35; H01L 23/3157; H01L 2225/06513; H01L 2225/06558; H01L 2225/06551; H01L 2225/06548; H01L 2225/06524; H01L 2225/06562; H01L 23/3128
See application file for complete search history.

(56) References Cited

U.S. PATENT DOCUMENTS

| | | | |
|---|---|---|---|
| 2002/0045290 A1 | 4/2002 | Ball | |
| 2004/0155326 A1* | 8/2004 | Kanbayashi | H01L 23/49816 257/E25.013 |
| 2005/0146005 A1* | 7/2005 | Shimoishizaka | H01L 25/0657 257/E29.022 |
| 2008/0303131 A1 | 12/2008 | McElrea et al. | |
| 2010/0140811 A1* | 6/2010 | Leal | H01L 24/76 257/E23.141 |
| 2015/0115476 A1* | 4/2015 | Chen | H01L 23/145 257/777 |
| 2015/0155199 A1 | 6/2015 | Kim et al. | |
| 2015/0221586 A1* | 8/2015 | Paek | H01L 24/49 257/668 |
| 2016/0020188 A1* | 1/2016 | Leal | H01L 21/76801 438/666 |
| 2016/0218088 A1* | 7/2016 | McElrea | H01L 29/0657 |
| 2016/0293578 A1* | 10/2016 | Hu | H01L 21/4853 |
| 2017/0162546 A1 | 6/2017 | Fai et al. | |
| 2018/0358263 A1* | 12/2018 | Akram | C23C 18/1831 |
| 2020/0020585 A1 | 1/2020 | Wakahara et al. | |
| 2020/0411496 A1* | 12/2020 | Zhang | H01L 25/50 |
| 2021/0043606 A1 | 2/2021 | Bowers et al. | |
| 2021/0057326 A1 | 2/2021 | Ding et al. | |
| 2021/0066247 A1 | 3/2021 | Fujisawa et al. | |

OTHER PUBLICATIONS

Chinese First Office Action for Chinese Application No. 202010994065.8, dated Jul. 21, 2023, 14 pages with translation.
Chinese Second Office Action for Chinese Application No. 202010994065.8, dated Mar. 6, 2024, 12 pages with translation.

* cited by examiner

SEMICONDUCTOR DEVICE PACKAGES INCLUDING CONDUCTORS ELECTRICALLY CONNECTING STACKED SEMICONDUCTOR DEVICES BY EXTENDING ALONG SURFACES OF THE SEMICONDUCTOR DEVICES

CROSS-REFERENCE TO RELATED APPLICATION

This application is a continuation of U.S. patent application Ser. No. 16/578,975, filed Sep. 23, 2019, now U.S. Pat. No. 11,171,109 issued Nov. 9, 2021, the disclosure of which is hereby incorporated herein in its entirety by this reference.

FIELD

This disclosure relates generally to semiconductor device packages and methods of fabricating semiconductor device packages. More specifically, disclosed embodiments relate to methods of fabricating semiconductor device packages in a format that may better integrate multiple semiconductor devices into a single package, reduce the likelihood of electrical shorts within the package, reduce package height, and improve operating performance at competitive or reduced cost in comparison to conventional packages.

BACKGROUND

When operatively connecting individual semiconductor devices to one another in a conventional manner, a first package including one or more first semiconductor devices may be assembled with a second package including one or more second semiconductor devices. For example, a first semiconductor device package may be stacked on top of a second semiconductor device package and electrically and mechanically connected thereto by a soldered connection. This kind of configuration is generally referred to as a "Package-on-Package" (PoP) configuration. Each of the first and second semiconductor device packages may include its own signal-routing structures, such as, for example, interposer substrates, redistribution layers, printed circuit boards, wire bonds, vias, solder posts, solder balls, solder bumps, and/or solder pillars. Each of the first and second semiconductor device packages may also be individually encapsulated, which encapsulant may enclose the first and second semiconductor device(s) in their respective packages before assembly of the packages.

FIG. 1 is a cross-sectional, partially exploded view of an existing technique for making an assembly 100 of semiconductor device packages 102 and 104 in a PoP configuration known to the inventors. The assembly 100 of FIG. 1 may include a first semiconductor device package 102 underlying a second semiconductor device package 104. The first semiconductor device package 102 may include, for example, one or more first semiconductor device(s) 106 supported on, and electrically connected to, a first substrate 108. First substrate 108 may comprise, for example, a dielectric material such as strontium barium titanate having conductive (e.g., copper) traces and vias formed therein. A first active surface 110 of the first semiconductor device 106 closest to the first substrate 108 may face the first substrate 108, a first inactive surface 112 of the first semiconductor device 106 being located on a side of the first semiconductor device 106 opposite the first substrate 108. The first active surface 110 of the first semiconductor device 106 may be electrically connected to the first substrate 108 utilizing conductive elements extending from bond pads of the first semiconductor device 106 to conductive traces of the first substrate 108. The first active surface 110 may include integrated circuitry embedded within, or supported on, semiconductor material of the first semiconductor device 106, and the first inactive surface 112 may lack such integrated circuitry. For example, the integrated circuitry of the first semiconductor device package 102 may include controller circuitry. The first substrate 108 may extend laterally beyond a periphery of the first semiconductor device 106, and first conductive elements 114 on under bump metallization (UBM) in electrical communication with the first semiconductor device 106 through the conductive traces and vias of first substrate 108 may be located on upper and lower surfaces of the first substrate 108. A first encapsulant 116 may encapsulate the first semiconductor device(s) 106 and cover at least portions of the exposed upper surface of the first substrate 108, with those first conductive elements 114 located on the upper surface remaining exposed through the first encapsulant 116.

The second semiconductor device package 104 may be supported on, and operably coupled to, the first semiconductor device package 102. The second semiconductor device package 104 may include, for example, one or more second semiconductor device(s) 118 supported on, and electrically connected to, a second substrate 120, for example of similar materials to those of first substrate 108. A second active surface 122 of the second semiconductor device 118 closest to the second substrate 120 may face away from the second substrate 120, a second inactive surface 124 of the second semiconductor device 118 being located on the same side of the second semiconductor device 118 as the second substrate 120. In other words, the first active surface 110 and the second active surface 122 may face in opposite directions. The second active surface 122 of the second semiconductor device package 104 may be electrically connected to the second substrate 120 utilizing wire bonds 126 extending from bond pads of the second semiconductor device 118 to conductive pads of the second substrate 120. The second active surface 122 may include integrated circuitry embedded within, or supported on, semiconductor material of the second semiconductor device 118, and the second inactive surface 124 may lack such integrated circuitry. For example, the integrated circuitry of the second semiconductor device package 104 may include memory circuitry. The second substrate 120 may extend laterally beyond a periphery of the second semiconductor device 118, and second conductive elements 128 in electrical communication with the second semiconductor device 118 through conductive traces of the second substrate 120 may be located on a lower surface of the first substrate 108. A second encapsulant 129 may encapsulate the second semiconductor device(s) 118 and cover at least portions of the exposed upper surface of the second substrate 120.

When connecting the first semiconductor device package 102 to the second semiconductor device package 104 to form the assembly 100, the first conductive elements 114 on the upper surface of the first substrate or RDL 108 may be aligned with and in contact with the second conductive elements 128 on the lower surface of the second substrate or RDL 120. For example, the second conductive elements 128 may be at least partially inserted into the openings in the upper surface of the first encapsulant 116, granting access to the first conductive elements 114. The upper set of first conductive elements 114 and the second conductive elements 128 may be reflowed to electrically and mechanically connect the first semiconductor device package 102 to the second semiconductor device package 104.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
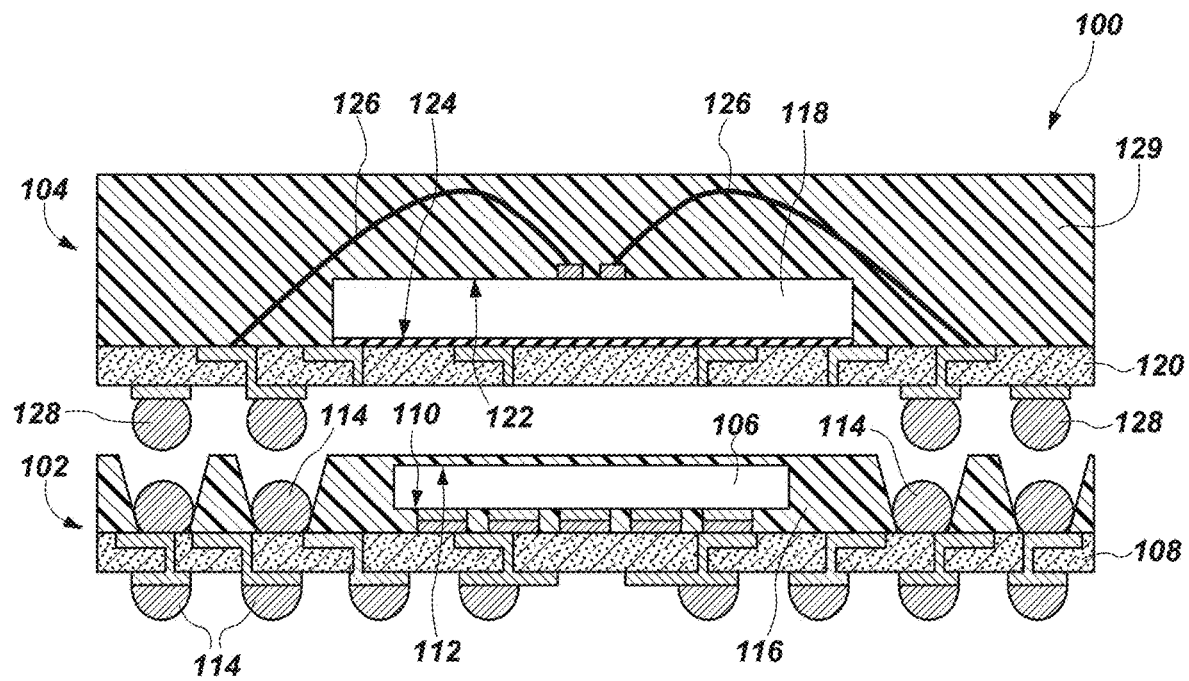
FIG. 1 is a cross-sectional, partially exploded view of an existing technique for making an assembly of semiconductor device packages known to the inventors.

The illustrations presented in this disclosure are not meant to be actual views of any particular semiconductor device package, intermediate product, or component thereof, but are merely idealized representations employed to describe illustrative embodiments. Thus, the drawings are not necessarily to scale.

Disclosed embodiments relate generally to methods of making semiconductor device packages that may better integrate semiconductor devices into a package, reduce the likelihood of electrical shorts within the package, reduce package height, and improve operating performance at competitive or reduced cost. More specifically, disclosed are embodiments of directly stack a first semiconductor device on a second semiconductor device and may utilize positioning dielectric material and electrically conductive material in a manner not typically employed within a package or across multiple semiconductor devices to electrically interconnect the first semiconductor device and the second semiconductor device.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, terms referring to absolute positioning and orientation are employed for convenience to refer to the position and orientation shown in the drawing associated with that term, and do not limit the position and orientation of the same or similar structures during actual formation and use. For example, the terms upper, lower, above, under, left, right, front, back, etc. refer to the position and orientation shown in the drawing figure those terms are used to describe. When actual assemblies and packages in accordance with this disclosure are being made or used, they may take on any absolute position and orientation, and the corresponding terms will have to be reinterpreted in light of the differences in position and orientation between those depicted in the figures and those actually employed. For example, a feature characterized as being "upper" relative to another feature may ultimately be on the right side, left side, front side, backside, or under that other feature depending on the direction and extent of rotation of those features relative to the drawings.

Figure 2:
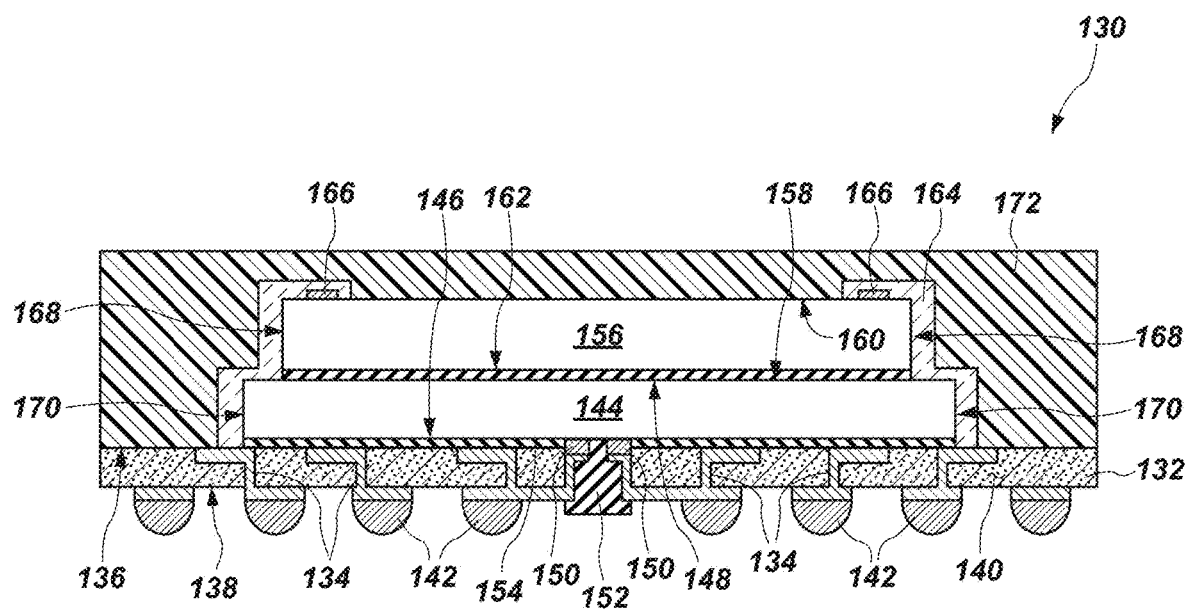
FIG. 2 is a cross-sectional view of a semiconductor device package in accordance with this disclosure.

FIG. 2 is a cross-sectional view of a semiconductor device package 130 in accordance with this disclosure. The semiconductor device package 130 may include a substrate 132 having routing members 134 in the form of conductive traces and vias for routing data, power and ground signals between a first major surface 136 and a second major surface 138 on an opposite (e.g., lower) side of the substrate 132. For example, the substrate 132 may include a dielectric material 140 and quantities of electrically conductive material in the form of the routing members 134 extending from the first major surface 136, through the dielectric material 140, to the second major surface 138. The dielectric material 140 may include, for example, an inorganic material (e.g., strontium barium titanate). The electrically conductive material of the routing members 134 may include, for example, copper, silver, aluminum, gold, or alloys or compositions including such materials. The substrate 132 may be configured as, for example, a printed circuit board or an interposer substrate and may function as a redistribution layer (RDL) for first semiconductor device 144.

Electrically conductive elements 142 may be positioned on the second major surface 138 and may be electrically connected to selected ones of the routing members 134. The conductive elements 142 may be configured as, for example, posts, balls, bumps, and/or pillars of electrically conductive material. The electrically conductive material of the conductive elements 142 may include, for example, tin, silver, copper, lead, or alloys or mixtures of one or more of these. As a specific, nonlimiting example, the conductive elements 142 may comprise solder bumps on UBM.

A first semiconductor device 144 may be supported on the substrate 132. In some embodiments, the first semiconductor device 144 may be a single, solitary semiconductor die, as shown in FIG. 1. In other embodiments, the first semiconductor device 144 may include a stack of semiconductor dice, as shown and described in greater detail in connection with FIG. 13. The first semiconductor device 144 may include, for example, a semiconductor die having a first active surface 146 including integrated circuitry embedded within, or supported on, semiconductor material of the first semiconductor device 144, and a first inactive surface 148 lacking such integrated circuitry. For example, the integrated circuitry of the first semiconductor device 144 may include memory circuitry. More specifically, the first semiconductor device 144 may be configured to operate as flash memory (e.g., NAND), programmable read-only memory (PROM), erasable programmable read-only memory (EPROM), electrically erasable programmable read-only memory (EEPROM), dynamic random access memory (DRAM), or static random access memory (SRAM). As a specific, nonlimiting example, the first semiconductor device 144 may be configured to operate as DRAM. In other embodiments, the integrated circuitry of the first semiconductor device 144 may include controller circuitry. More specifically, the first semiconductor device 144 may be configured to operate as a logic controller for other semiconductor devices, such as the second semiconductor device 156 described in greater detail below. As a specific, nonlimiting example, the first semiconductor device 144 may be configured to operate as a DRAM logic controller.

The first active surface 146 may face the substrate 132, and the first semiconductor device 144 may be at least substantially directly electrically connected to the substrate 132. For example, the first active surface 146 may include first bond pads 150 aligned and in contact with conductive pads of corresponding routing members 134 of the substrate 132 at the first major surface 136, and electrically conductive elements 152 in the form of pillars formed on the first bond pads 150 and diffusion bonded to the conductive pads of associated routing members 134. More specifically, the first semiconductor device 144 may be in a flip-chip orientation, with the first active surface 146 facing the substrate 132, and the conductive elements 152 may extend from the first bond pads 150, which may be located in two rows flanking and located adjacent to a geometrical centerline of the first active surface 146 (e.g., as viewed into and/or out of the page as shown in FIG. 2), to the conductive pads of associated routing members 134 directly underlying the first bond pads 150. The conductive elements 152, instead of being configured as pillars, may be configured as, for example, posts, balls, bumps, and/or pillars of electrically conductive material. The electrically conductive material of the conductive elements 142 may include, for example, tin, silver, copper, lead, or alloys or mixtures of one or more of these. As a specific, nonlimiting example, the conductive elements 142 may comprise copper pillars.

The first bond pads 150 may further be electrically connected to conductive pads of routing members 134 that do not directly underlie, and are not otherwise aligned with, the first bond pads 150. For example, traces of an electrically conductive material 154 may be interposed between the first active surface 146 of the first semiconductor device 144 and the first major surface 136 of the substrate 132. The electrically conductive material 154 may further be in direct contact with the first bond pads 150 and/or the conductive elements 152 as well as exposed conductive pads of routing members 134 at the first major surface 136 of the substrate 132. For example, the electrically conductive material 154 may be in direct contact with the lateral sides of the conductive elements 152 and may be in direct contact with upper surfaces of conductive pads of the routing members 134 forming part of, or protruding from, the first major surface 136 of the substrate 132. The electrically conductive material 154 may include, for example, a conductive paste. More specifically, the electrically conductive material 154 may include, for example, silver paste.

A second semiconductor device 156 may be supported on or over the first semiconductor device 144. For example, the second semiconductor device 156 may be located on a side of the first semiconductor device 144 opposite the substrate 132. More specifically, the second semiconductor device 156 may be affixed to the first inactive surface 148 of the first semiconductor device 144 by an adhesive material 158 interposed between the first semiconductor device 144 and the second semiconductor device 156. The adhesive material 158 may include, for example, a dielectric polymer material. More specifically, the adhesive material 158 may include, for example, a die-attach film (DAF) or a molded underfill (MUF).

The second semiconductor device 156 may include, for example, a semiconductor die having a second active surface 160 including integrated circuitry embedded within, or supported on, semiconductor material of the second semiconductor device 156, and a second inactive surface 162 lacking such integrated circuitry. For example, the integrated circuitry of the second semiconductor device 156 may include controller circuitry. More specifically, the second semiconductor device 156 may be configured to operate as a logic controller for the first semiconductor device(s) 144. As a specific, nonlimiting example, the second semiconductor device 156 may be configured to operate as a DRAM logic controller. In a specific embodiment where the first semiconductor device 144 is configured as a memory device and the second semiconductor device 156 is configured as a logic controller for the first semiconductor device 144, the semiconductor device package may manage heat generated by the second semiconductor device 156 more effectively because, unlike the package arrangement shown in FIG. 1, the relatively higher power second semiconductor device 156 is located closer to the top, and closer to the exterior, of the semiconductor device package 130. In other embodiments, the integrated circuitry of the second semiconductor device 156 may include memory circuitry. More specifically, the second semiconductor device 156 may be configured to operate as flash memory (e.g., NAND), programmable read-only memory (PROM), erasable programmable read-only memory (EPROM), electrically erasable programmable read-only memory (EEPROM), dynamic random access memory (DRAM), or static random access memory (SRAM). As a specific, nonlimiting example, the second semiconductor device 156 may be configured to operate as DRAM.

The second active surface 160 may face away from the substrate 132 and the first semiconductor device 144, and the second semiconductor device 156 may be electrically connected to routing members 134 of the substrate 132 by electrical interconnections 164 in the form of conductive traces. For example, the electrical interconnections 164 may extend from second bond pads 166 of the second semiconductor device 156, over and along surfaces of the second semiconductor device 156, first semiconductor device 144, and substrate 132 to routing members 134 of the substrate 132. More specifically, each interconnection 164 may extend, for example, from an associated second bond pad 166 on the second active surface 160, over the second active surface 160 toward a lateral periphery of the second semiconductor device 156, over a second lateral side surface 168 of the second semiconductor device 156 (the second lateral side surface 168 extending longitudinally from the second active surface 160 to the second inactive surface 162) toward the first inactive surface 148 of the first semiconductor device 144, over the first inactive surface 148 laterally outward toward a lateral periphery of the first semiconductor device 144, over a first lateral side surface 170 of the first semiconductor device 144 (the first lateral side surface 170 extending longitudinally from the first active surface 146 to the first inactive surface 148) toward the first major surface 136 of the substrate 132, and to an exposed conductive pad of a corresponding routing member 134 at the first major surface 136 of the substrate 132. The interconnection 164 may be configured as, and may be formed utilizing the same techniques applicable to a RDL. Additional detail regarding the interconnection(s) 164 is provided in connection with FIG. 3.

The second bond pads 166 may be located, for example, in rows extending proximate to the second lateral side surfaces 168, distal from the geometric center, of the second semiconductor device 156 and more closely adjacent opposing lateral peripheries of second semiconductor device 156. More specifically, the lateral distance between the second bond pads 166 and the second lateral side surfaces 168 may be, for example, less than the lateral distance between the second bond pads 166 and the geometric center of the second semiconductor device 156. As a specific, nonlimiting example, the lateral distance between the second bond pads 166 and the second lateral side surfaces 168 may be between about 10% and about 25% of the lateral distance between the second bond pads 166 and the geometric center of the second semiconductor device 156. The corresponding routing members 134 may be located laterally proximate to the first lateral side surface(s) 170 of the first semiconductor device 144.

A lateral footprint of the second semiconductor device 156 may be smaller than the lateral footprint of the first semiconductor device 144. For example, at least a portion of the first semiconductor device 144 may extend laterally beyond a periphery of the second semiconductor device 156 on at least one lateral side. More specifically, portions of the first inactive surface 148 of the first semiconductor device 144 may extend laterally beyond the second lateral side surfaces 168 of the second semiconductor device 156 on at least two opposite lateral sides of the second semiconductor device 156. As a specific, nonlimiting example, a peripheral portion of the first inactive surface 148 of the first semiconductor device 144 may extend laterally beyond the second lateral side surfaces 168 of the second semiconductor device 156 on each lateral side of the second semiconductor device 156 (e.g., on four lateral sides in embodiments where the second semiconductor device 156 is rectangular). The second semiconductor device 156 may be, for example, centered on the first inactive surface 148 of the first semiconductor device 144, such that a lateral distance between each respective second lateral side surfaces 168 and the closest first lateral side surface 170, as measured in a direction parallel to the first inactive surface 148, is at least substantially equal to the same lateral distance for each other respective second lateral side surfaces 168 and the closest first lateral side surface 170. In other embodiments, the second semiconductor device 156 may be offset from center with respect to the first semiconductor device 144.

At least a portion of each of the substrate 132, the first semiconductor device(s) 144, the second semiconductor device(s) 156, and the interconnection(s) 164 may be encapsulated in an encapsulant 172. For example, the encapsulant 172 may be located on a side of each of the foregoing components opposite the second major surface 138 of the substrate 132. More specifically, the encapsulant 172 may cover and be in direct contact with a portion of the second active surface 160 of the second semiconductor device 156, at least uppermost and laterally outermost portions of the interconnection(s) 164, and portions of the first major surface 136 of the substrate 132 proximate to a lateral periphery of the semiconductor device package 130. The encapsulant 172 may include, for example, a dielectric, polymer material. More specifically, the encapsulant 172 may include, for example, a molding compound such as an epoxy resin material. The encapsulant 172 may not be located underneath the interconnection 164. For example, none of the encapsulant 172 may be interposed between the interconnection 164 and the first semiconductor device 144, second semiconductor device 156, and substrate 132.

Figure 3:
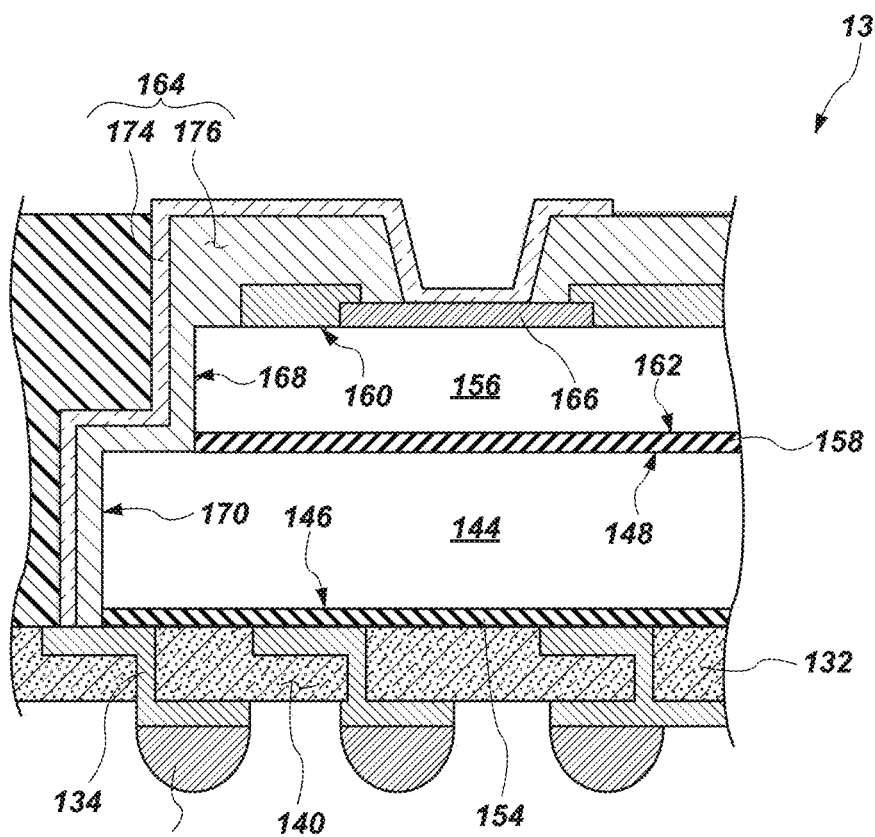
FIG. 3 is an enlarged cross-sectional view of a portion of the semiconductor device package of FIG. 2.

FIG. 3 is an enlarged cross-sectional view of a portion of the semiconductor device package 130 of FIG. 2. The interconnections 164 may include, for example, electrical conductors 174 that may directly contact respective second bond pads 166 and conductive pads of associated routing members 134. The interconnections 164 may further include an underlying dielectric material 176, which may be interposed between the conductors 174 and the other portions of the first semiconductor device 144, the second semiconductor device 156, and the substrate 132 underlying the conductors 174. For example, each electrical interconnection 164 may include a conductor 174 in contact with an associated second bond pad 166 and conductive pad of a corresponding routing member 134 and a dielectric material 176 interposed between the conductor 174 and the first semiconductor device 144 and a remainder of the second semiconductor device 156. More specifically, the dielectric material 176 may, for example, laterally surround the exposed second bond pads 166 over passivation material on the second active surface 160 of the second semiconductor device 156 and may laterally surround the routing members 134 on the first major surface 136 of the substrate 132. The dielectric material 176 may also be located on, and in direct contact with, portions of the second active surface 160, the second lateral side surface(s) 168, the adhesive material 158, portions of the first inactive surface 148, the first lateral side surface(s) 170, the conductive material 154, and the portions of the first major surface 136. Electrically conductive material of the conductors 174 may include, for example, copper, silver, aluminum, gold, or alloys including such materials. The dielectric material 176 may include, for example, a polymer material distinct from the encapsulant 172. More specifically, the dielectric material 176 may include, for example, an epoxy material or a polyimide.

The interconnection(s) 164 may be formed utilizing materials and processes similar to (or the same as) those known to the inventors for forming RDLs in certain embodiments. For example, RDL formation techniques in accordance with this disclosure may be utilized to form interconnections 164 among stacked semiconductor devices within a package. This may be accomplished in part by using such RDL formation techniques to place the materials that form the interconnection(s) 164 directly on exposed surfaces of the second bond pad(s) 166, routing member(s) 134, stacked semiconductor devices (e.g., second semiconductor device(s) 156 and first semiconductor device(s) 144), and substrate 132.

As a summary, semiconductor device packages in accordance with certain embodiments of this disclosure may include a first semiconductor device over a substrate and a second semiconductor device over the first semiconductor device. An active surface of the second semiconductor device may face away from the substrate. At least one electrical interconnection may extend from a bond pad of the second semiconductor device, along surfaces of the second semiconductor device, first semiconductor device, and substrate to a routing member of the substrate. The at least one electrical interconnection may include a conductor in contact with the bond pad and the routing member and a dielectric material interposed between the conductor and the first semiconductor device, the second semiconductor device, and the substrate between the bond pad and the routing member. An encapsulant distinct from the dielectric material may extend over the at least one electrical interconnection and exposed surfaces of the first semiconductor device, the second semiconductor device, and an upper surface of the substrate.

Figure 4:
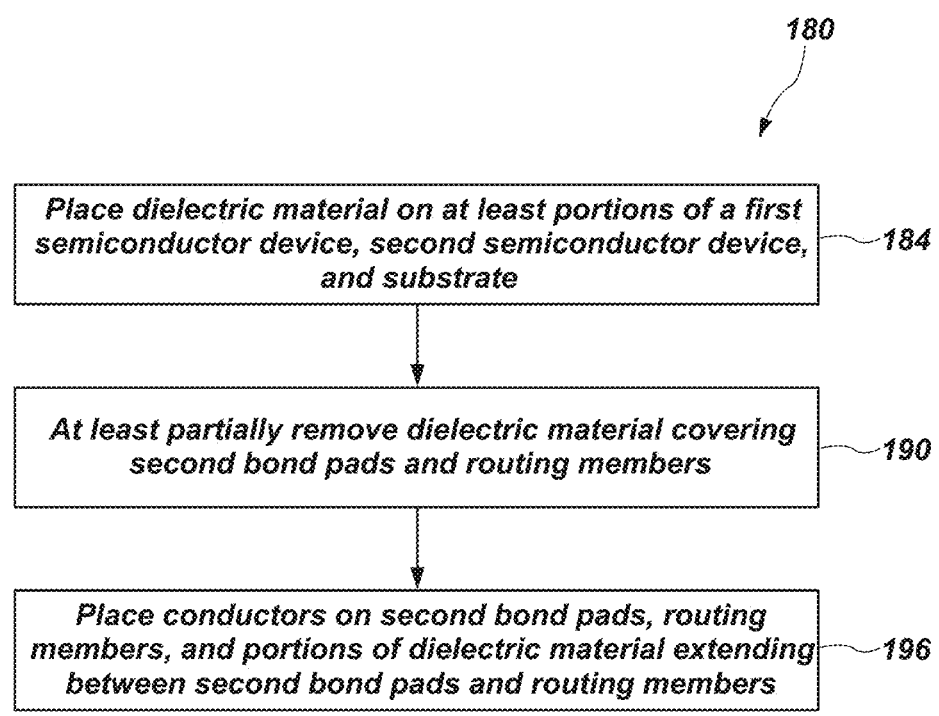
FIG. 4 is a flowchart of a method of forming the semiconductor device package of FIG. 2.
Figure 5:
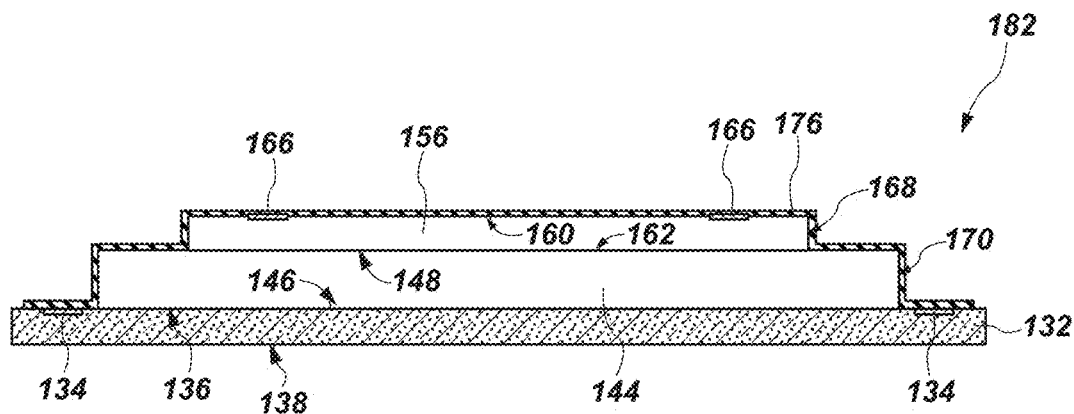
FIG. 5 is a cross-sectional view of a first intermediate product in a first stage of the method of FIG. 4.

FIG. 4 is a flowchart of a method 180 of forming the semiconductor device package 130 of FIG. 2, and FIG. 5 is a cross-sectional view of a first intermediate product 182 in a first stage of the method of FIG. 4. For the sake of simplicity, certain features of the resulting semiconductor device package 130 (see FIG. 2) that do not directly relate to the formation of the interconnection 164 have been omitted in FIGS. 5 through 11. With combined reference to FIGS. 4 and 5, the method 180 may involve placing the dielectric material 176 on at least portions of the first semiconductor device 144, second semiconductor device 156, and substrate 132, as shown at act 184. For example, the dielectric material 176 may completely cover the second active surface 160, including the second bond pads 166 thereon, the second lateral side surfaces 168 at least on opposite lateral sides of the second semiconductor device 156, portions of the first inactive surface 148 extending laterally beyond the second lateral side surfaces 168 of the second semiconductor device 156, the first lateral side surfaces 170 at least on opposite lateral sides of the first semiconductor device 144, and at least a portion of the first major surface 136 of the substrate 132 proximate to the associated routing member(s) 134. The dielectric material 176 may be placed by, for example, dispensing from a dispenser (e.g., a nozzle) while in a flowable state, spray coating, spin coating, chemical vapor deposition. In some embodiments, the dielectric material 176 may be a curable material, and curing may take place during act 184.

As a precursor to act 184, one or more of the first semiconductor device 144, second semiconductor device 156, and substrate 132 may be formed and/or assembled with one another. For example, first semiconductor device 144 may be formed, the second semiconductor device 156 may be formed, the substrate 132 may be formed, the first semiconductor device 144 may be supported on, and affixed to, the substrate 132, the second semiconductor device 156 may be supported on, and affixed to, the first semiconductor device 144, or any combination or subcombination of these. In other embodiments, the first semiconductor device 144, second semiconductor device 156, and substrate 132 may be provided as a pre-assembled component.

Figure 6:
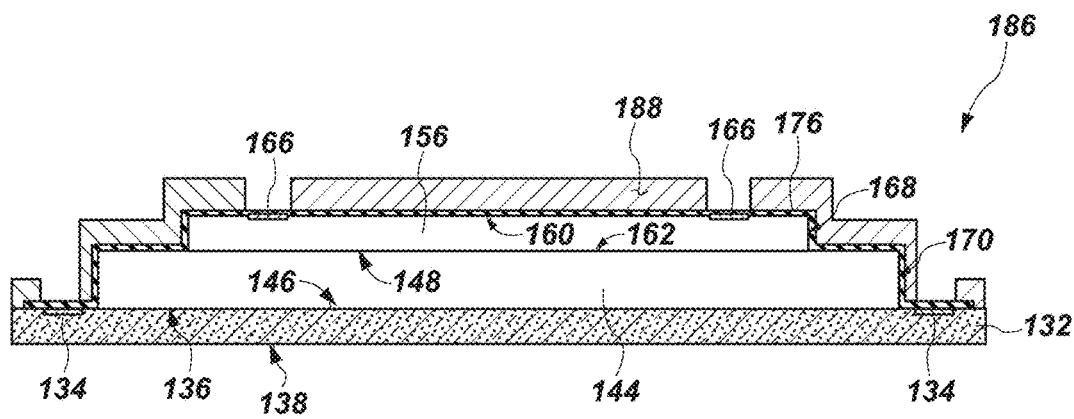
FIG. 6 is a cross-sectional view of a second intermediate product in a second stage of the method of FIG. 4.

FIG. 6 is a cross-sectional view of a second intermediate product 186 in a second stage of the method 180 of FIG. 4. With combined reference to FIGS. 4 and 6, the method 180 may involve at least partially removing those portions of the dielectric material 176 covering the second bond pads 166 of the second semiconductor device 156 and at least some of the routing members 134 of the substrate 132 at the first major surface 136, as indicated at act 190. For example, a protective material 188 may be selectively positioned over the remainder of the dielectric material 176 not to be removed. The protective material 188 may include, for example, a polymer material. More specifically, the protective material 188 may include a positive or negative photoresist. The protective material 188 may initially cover an entirety of the dielectric material 176 and any exposed portions of the substrate 132 located laterally beyond the dielectric material 176. The protective material 188 may be positioned by, for example, a spray coating or spin coating process. Portions of the protective material 188 overlying at least portions of the second bond pads 166 and at least some of the routing members 134 at the first major surface 136 may be patterned for removal by, for example, photolithography.

Figure 7:
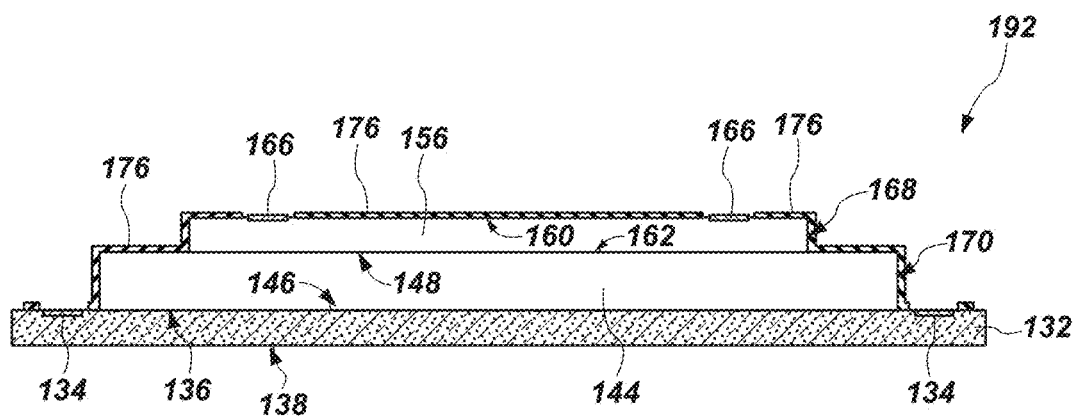
FIG. 7 is a cross-sectional view of a third intermediate product in a third stage of the method of FIG. 4.

FIG. 7 is a cross-sectional view of a third intermediate product 192 in a third stage of the method of FIG. 4. With combined reference to FIGS. 4 and 7, the process of removing portions of the dielectric material 176 associated with act 190 may continue. After removing those portions of the protective material 188 (see FIG. 6) overlying at least portions of the second bond pads 166 and at least some of the routing members 134 at the first major surface 136, the exposed portions of the dielectric material 176 may be removed. For example, the exposed portions of the dielectric material 176 may be exposed to a solvent that does not dissolve the protective material 188 (see FIG. 6) or an etching process (e.g., dry etch, wet etch) may be used to remove the exposed portions of the dielectric material 176. A remainder of the protective material 188 (see FIG. 6) may then also be removed subsequently by, for example, exposure to a solvent.

Figure 8:
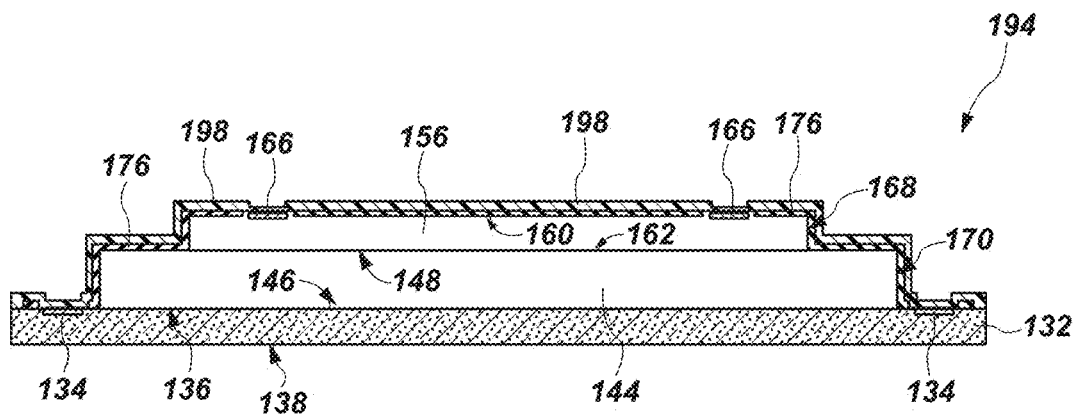
FIG. 8 is a cross-sectional view of a fourth intermediate product in a fourth stage of the method of FIG. 4.

FIG. 8 is a cross-sectional view of a fourth intermediate product 194 in a fourth stage of the method 180 of FIG. 4. With combined reference to FIGS. 4 and 8, the method 180 may involve placing the conductors 174 on the exposed portions of the second bond pads 166, the exposed portions of the routing members 134, and the portions of the dielectric material 176 extending between the second bond pads 166 and the routing members 134, as shown at act 196. A seed material 198 may be placed on portions of the exposed surfaces of the third intermediate product 192 (see FIG. 7). For example, the seed material 198 may be located on portions of those exposed surfaces of the dielectric material 176, the second bond pads 166, the associated routing members 134, and portions of the dielectric material 140 of the substrate 132 extending between a second bond pad 166 and an associated routing member 134. The seed material 198 may include, for example, a material configured to facilitate deposition and adherence of an electrically conductive material of the conductors 174 (see FIG. 2) on the second bond pads 166, associated routing members 134, and dielectric material 176 extending therebetween. More specifically, the seed material 198 may include, for example, a metal or metal alloy material. As a specific, nonlimiting example, the seed material 198 may include, for example, nickel, chromium, tantalum or alloys including such materials. The seed material 198 may be deposited by, for example, chemical vapor deposition (including atomic layer deposition) or physical vapor deposition (i.e., sputtering).

Figure 9:
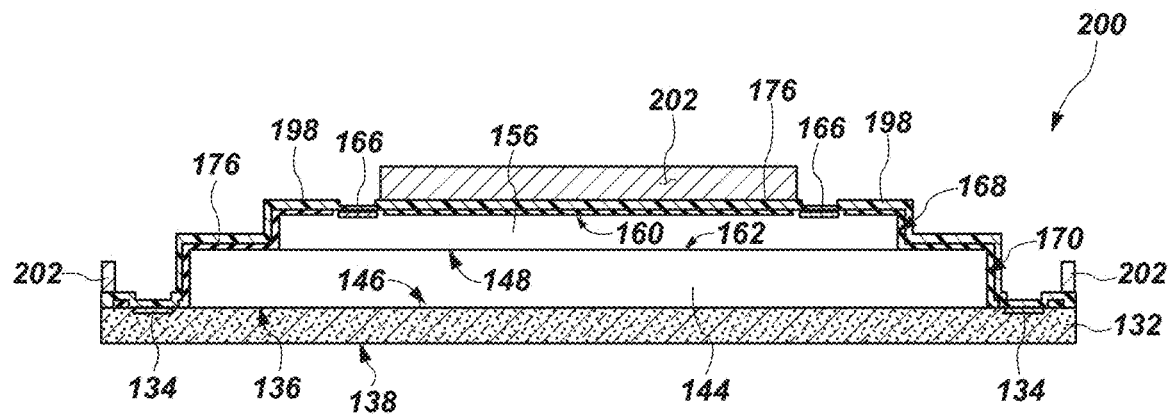
FIG. 9 is a cross-sectional view of a fifth intermediate product in a fifth stage of the method of FIG. 4.

FIG. 9 is a cross-sectional view of a fifth intermediate product 200 in a fifth stage of the method 180 of FIG. 4. With combined reference to FIGS. 4 and 8, the act 196 of positioning the conductors 174 may continue by placing another protective material 202 on portions of the seed material 198 as a template for subsequent formation of conductors 174. For example, the other protective material 202 may be located proximate to the geometric center of the second semiconductor device 156 on a side of the seed material 198 opposite the second semiconductor device 156. As another example, the other protective material 202 may be located proximate to the periphery of the substrate 132 on a side of the substrate 132 opposite the second major surface 138. More specifically, the other protective material 202 may extend from the periphery of the substrate 132 laterally inward to proximate the associated routing members 134. The other protective material 202 may include any of the materials, and may be placed and patterned using any of the processes, described previously in connection with the protective material 188 (see FIG. 6).

Figure 10:
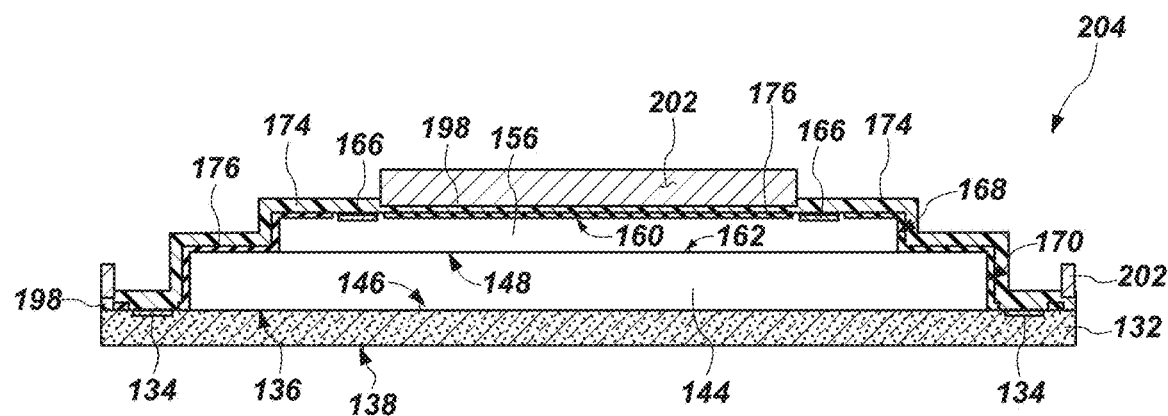
FIG. 10 is a cross-sectional view of a sixth intermediate product in a sixth stage of the method of FIG. 4.

FIG. 10 is a cross-sectional view of a sixth intermediate product 204 in a sixth stage of the method 180 of FIG. 4. With combined reference to FIGS. 4 and 8, electrically conductive material of the conductors 174 may then be placed on the portions of the seed material 198 still exposed beyond the lateral extents of the quantities of the other protective material 202, completing act 196. The electrically conductive material of the conductors 174 may be deposited on exposed portions of the seed material 198 by, for example, a plating process (e.g., electroplating, electroless chemical plating). The interconnections 164 may then be complete.

Figure 11:
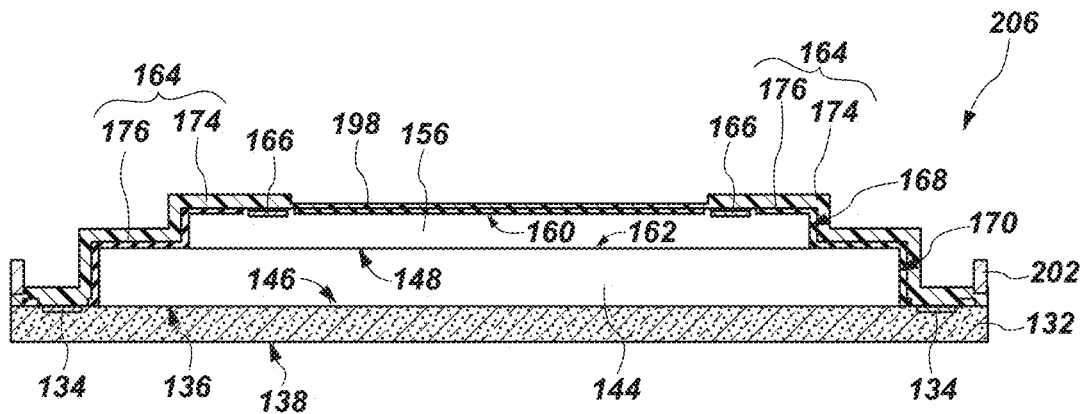
FIG. 11 is a cross-sectional view of a seventh intermediate product in a seventh stage of the method of FIG. 4.

FIG. 11 is a cross-sectional view of a seventh intermediate product 206 in a seventh stage of the method 180 of FIG. 4. Following formation of the interconnections 164, the other protective material 202 and any remaining portions of the seed material 198 underlying the other protective material 202 may be removed. Removal of the other protective material 202 (and unplated seed material 198) may be accomplished using any of the removal processes described previously in connection with the protective material 188 (see FIGS. 6, 7). Formation of the semiconductor device package 130 (see FIG. 2) may then be completed by, for example, encapsulating the exposed components on a side of the substrate 132 opposite the second major surface 138 in the encapsulant 172 (see FIG. 2) with an epoxy molding compound.

As another summary, methods of making semiconductor device packages in accordance with certain embodiments of this disclosure may involve placing a dielectric material on at least portions of a first semiconductor device, a second semiconductor device, and a substrate, the first semiconductor device supported on or above the substrate, the second semiconductor device supported on or above the first semiconductor device. At least a portion of the dielectric material covering bond pads of the second semiconductor device and pads of associated routing members of the substrate may be removed. Conductors comprising electrically conductive material may be placed on the bond pads, the pads of associated routing members, and portions of the dielectric material extending between the bond pads and the pads of the routing members.

As still another summary, intermediate products in methods of making semiconductor device packages in accordance with certain embodiments of this disclosure may include a first semiconductor device supported on or above a substrate and a second semiconductor device supported on or above the first semiconductor device. An active surface of the second semiconductor device may face away from the substrate. Electrical interconnections may extend from bond pads of the second semiconductor device, along surfaces of the second semiconductor device, first semiconductor device, and substrate to routing members of the substrate. The electrical interconnections may include conductors respectively in contact with bond pads and routing members and a dielectric material interposed between the conductors and surfaces of the first semiconductor device and the second semiconductor device.

Figure 12:
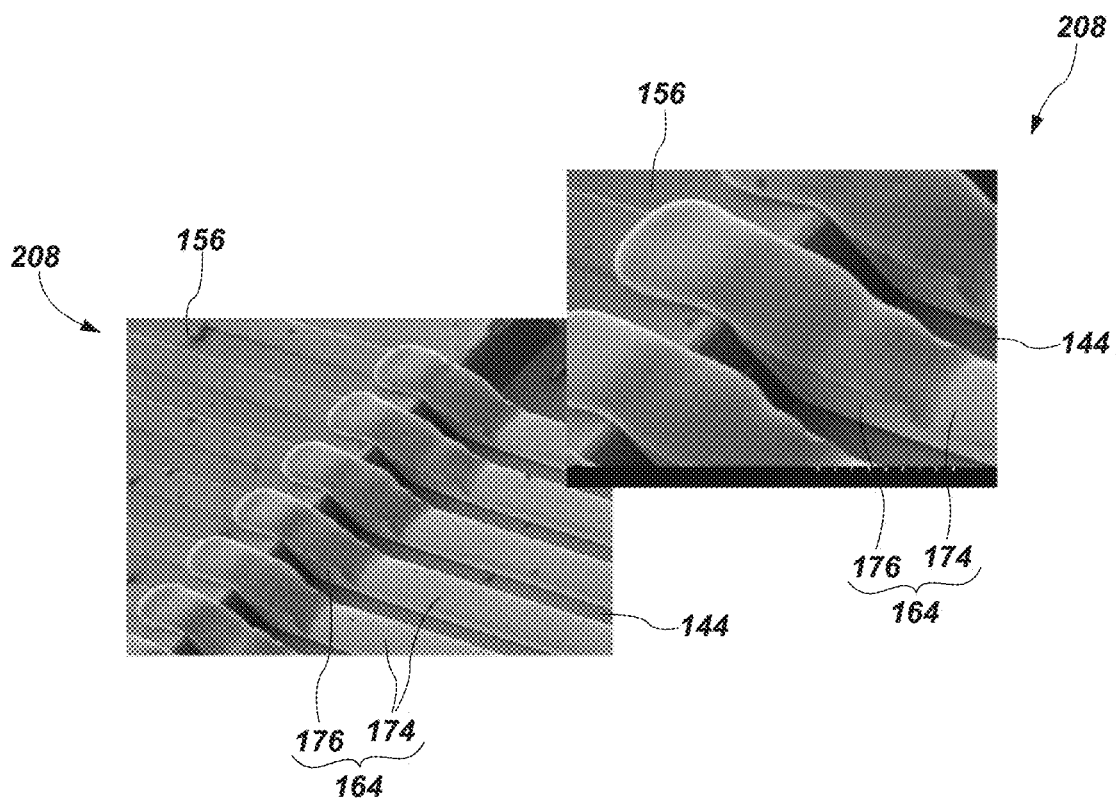
FIG. 12 is a pair of photomicrographs depicting how portions of electrical interconnections in accordance with this disclosure may appear under magnification.

FIG. 12 is a pair of photomicrographs 208 depicting how portions of electrical interconnections 164 in accordance with this disclosure may appear under magnification. The conductors 174 may be characterized by wide, thick and robust masses of electrically conductive material, particularly when compared to the diameters of wire bonds 126 (see FIG. 1). In addition, the positioning and pathways followed by the interconnections 164 may more closely follow the profile of the underlying components of the semiconductor device package 130.

Figure 13:
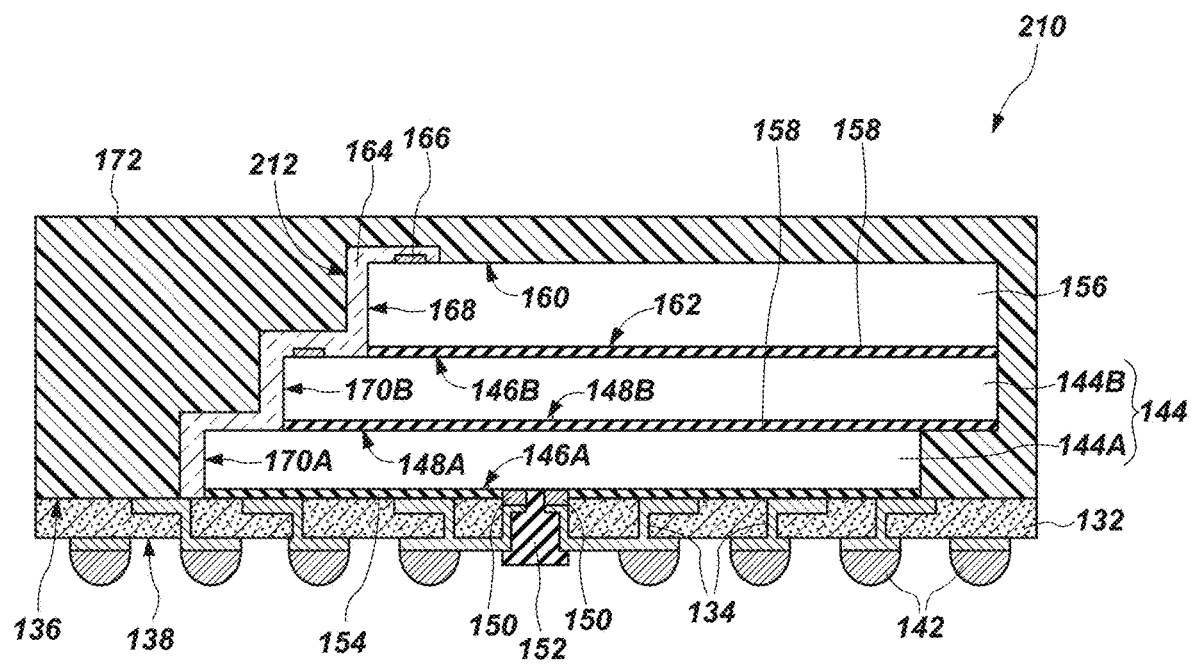
FIG. 13 is a cross-sectional view of another embodiment of a semiconductor device package in accordance with this disclosure.

FIG. 13 is a cross-sectional view of another embodiment of a semiconductor device package 210 in accordance with this disclosure. The semiconductor device package 210 may be configured at least substantially similarly to the semiconductor device package 130 of FIG. 1, with notable exceptions highlighted below. For example, the semiconductor device package 210 may include a substrate 132 having routing members 134 in the form of conductive traces and vias for routing data, power and ground signals between a first major surface 136 and a second major surface 138 on an opposite (e.g., lower) side of the substrate 132. The substrate 132 may be configured as, for example, a printed circuit board or an interposer substrate and may function as a redistribution layer (RDL) for one or more first semiconductor dice 144A and 144B. Electrically conductive elements 142 may be positioned on the substrate 132 and may be electrically connected to selected ones of the routing members 134.

Multiple first semiconductor dice 144A and 144B may be supported over the substrate 132. For example, a bottom-most first semiconductor die 144A in the stack may be supported on the substrate 132 and one or more additional first semiconductor dice 144B in the stack may be stacked on the bottom-most first semiconductor die 144A on a side of the bottom-most first semiconductor die 144A opposite the substrate 132. A first active surface 146A of the bottom-most first semiconductor die 144A may face toward the substrate 132. A first active surface 146B of each overlying first semiconductor die 144B may face away from the substrate 132 and be located on a side of the respective overlying additional first semiconductor die 144B opposite the bottom-most first semiconductor die 144A. Each additional first semiconductor die 144B may have a smaller lateral footprint than, and/or may be laterally offset relative to, an immediately underlying first semiconductor die (e.g., the bottom-most first semiconductor die 144A), which may expose a first bond pad 212 proximate a lateral periphery of first active surface 146B of certain additional first semiconductor dice 144B for connection to the electrical interconnection 164 in some embodiments. In other embodiments, at least the additional first semiconductor die 144B directly overlying the bottom-most first semiconductor die 144A opposite the substrate 132 may have a lateral footprint equal to or greater than, and/or may not be laterally offset relative to, the bottom-most first semiconductor die 144A. The first bond pads 212 may be located, for example, in rows extending proximate to the first lateral side surfaces 170B, distal from the geometric center, of the additional first semiconductor dice 144B and more closely adjacent the lateral periphery of the additional first semiconductor dice 144B. In some embodiments, the first semiconductor dice 144A and 144B in the stack may cooperatively operate to perform a task, such that the first semiconductor dice 144A and 144B in the stack may be said to form a first semiconductor device 144.

The first semiconductor dice 144A and 144B may include, for example, integrated circuitry configured as memory circuitry or controller circuitry, as described previously in connection with FIG. 1. As specific, nonlimiting examples, each first semiconductor die 144A and 144B may be configured to operate as flash memory (e.g., NAND), programmable read-only memory (PROM), erasable programmable read-only memory (EPROM), electrically erasable programmable read-only memory (EEPROM), dynamic random access memory (DRAM), or static random access memory (SRAM), or the bottom-most first semiconductor die 144A may be configured to operate as a controller for memory and each overlying, additional first semiconductor die 144B may be configured to operate as memory.

A second semiconductor device 156 may be supported on or over the stack of first semiconductor dice 144A and 144B. For example, the second semiconductor device 156 may be located on a side of the stack of first semiconductor dice 144A and 144B opposite the substrate 132. The integrated circuitry of the second semiconductor device 156 may include controller circuitry or memory circuitry. In a specific embodiment where each first semiconductor die 144A and 144B is configured as a memory device and the second semiconductor device 156 is configured as a logic controller for the first semiconductor device 144, the semiconductor device package may manage heat generated by the second semiconductor device 156 more effectively because, unlike the package arrangement shown in FIG. 1, the relatively higher power second semiconductor device 156 is located closer to the top, and closer to the exterior, of the semiconductor device package 210.

The second semiconductor device 156 may have a smaller lateral footprint than, and/or may be laterally offset relative to, an immediately underlying first semiconductor die (e.g., the upper-most first semiconductor die 144B). Such relative positioning for the lateral periphery of the second semiconductor device 156 and the underlying first semiconductor die 144B may expose a first bond pad 212 proximate a lateral periphery of first active surface 146B of the immediately underlying first additional semiconductor dice 144B for connection to the electrical interconnection 164.

The second semiconductor device 156 and each first semiconductor die 144B interposed between the second semiconductor device 156 and the bottom-most first semiconductor die 144A may be electrically connected to routing members 134 of the substrate 132 by electrical interconnections 164 in the form of conductive traces. For example, the electrical interconnections 164 may extend from second bond pads 166 of the second semiconductor device 156, over and along surfaces of the second semiconductor device 156 and immediately underlying additional first semiconductor die 144B, to first bond pads 212 of each additional first semiconductor die 144B, and over and along surfaces of the first semiconductor dice 144A and 144B and substrate 132 to routing members 134 of the substrate 132. More specifically, each interconnection 164 may extend, for example, from an associated second bond pad 166 on the second active surface 160, over the second active surface 160 toward a lateral periphery of the second semiconductor device 156, over a second lateral side surface 168 of the second semiconductor device 156 (the second lateral side surface 168 extending longitudinally from the second active surface 160 to the second inactive surface 162) toward the first active surface 146B of the immediately underlying, additional first semiconductor die 144B, over the first active surface 146A laterally outward to the first bond pad 212, laterally outward toward a lateral periphery of the additional first semiconductor die 144B, over a first lateral side surface 170B of the additional first semiconductor die 144B (the first lateral side surface 170B extending longitudinally from the first active surface 146B to the first inactive surface 148B) toward the bottom-most first semiconductor die 144A, laterally outward over the first inactive surface 148A of the bottom-most first semiconductor die 144A toward the lateral periphery of the bottom-most first semiconductor die 144A, over the first lateral side surface 170A of the bottom-most first semiconductor die 144A toward the first major surface 136 of the substrate 132, and to an exposed conductive pad of a corresponding routing member 134 at the first major surface 136 of the substrate 132. The interconnection 164 may be configured as, and may be formed utilizing the same techniques applicable to a RDL. Additional detail regarding the interconnection(s) 164 is provided in connection with FIG. 3.

Applying techniques known to the inventors for forming RDLs to instead, or also, form interconnections among semiconductor devices of a package, as disclosed herein, may allow the resulting package to have a lower height above the underlying substrate. In addition, techniques and structures in accordance with this disclosure may result in lower resistance and faster signal transmission with higher quality and fidelity. Interconnections as disclosed herein may reduce (e.g., eliminate) reliance on wire bonds, which may be susceptible to breaking, sweep, shorting, and other reliability issues during encapsulation. As a result, interconnections in accordance with this disclosure may allow integration of multiple semiconductor devices into a single package where multi-package assembly techniques were previously required or preferred at competitive or reduced cost.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A semiconductor device package, comprising:
   a first semiconductor device over a substrate;
   a second semiconductor device over the first semiconductor device, an active surface of the second semiconductor device facing away from the substrate;
   at least one conductor extending from a bond pad of the second semiconductor device, along surfaces of the second semiconductor device, the first semiconductor device, and the substrate to a conductive pad of the substrate, the at least one conductor in contact with the bond pad and the conductive pad and a dielectric material interposed between the at least one conductor and the first semiconductor device and between the at least one conductor and the second semiconductor device, a lateral side surface of the first semiconductor device intersecting the conductive pad;
   at least another conductor extending from another bond pad of the second semiconductor device, along other surfaces of the second semiconductor device, first semiconductor device, and substrate to another conductive pad of the substrate, the at least another conductor located on a lateral side of the second semiconductor device opposite the at least one conductor; and
   an encapsulant distinct from the dielectric material extending over the at least one conductor, the at least another conductor, at least one surface of the second semiconductor device, and an upper surface of the substrate, the encapsulant covering a portion of the conductive pad proximate to a location where the at least one conductor and the dielectric material extend continuously and conformally over the lateral side surface of the first semiconductor device and wherein each of the encapsulant, the at least one conductor, and the dielectric material contact the conductive pad;
wherein the first semiconductor device is affixed to the substrate with another active surface of the first semiconductor device facing the substrate; and;
wherein other bond pads of the first semiconductor device are located adjacent to a geometric centerline of the first semiconductor device.

2. The semiconductor device package of claim 1, wherein the semiconductor device package lacks wire bonds extending from the second semiconductor device to the substrate.

3. The semiconductor device package of claim 1, wherein the at least one conductor comprises a seed material and an electrically conductive material plated on the seed material.

4. The semiconductor device package of claim 1, wherein a space between the at least one conductor and the first semiconductor device and between the at least one conductor and the second semiconductor device lacks the encapsulant in the space.

5. The semiconductor device package of claim 1, wherein the first semiconductor device is configured as a logic controller and the second semiconductor device is configured as a memory device.

6. The semiconductor device package of claim 1, further comprising a third semiconductor device over the second semiconductor device, an active surface of the third semiconductor device facing away from the substrate.

7. The semiconductor device package of claim 6, wherein a lateral toot print of the third semiconductor device is smaller than a lateral footprint of the second semiconductor device and wherein the third semiconductor device is laterally offset relative to the second semiconductor device.

8. The semiconductor device package of claim 1, further comprising an electrically conductive material comprising traces interposed between the first semiconductor device and the substrate laterally operably coupled to the other bond pads of the first semiconductor device and to routing members of the substrate.

9. The semiconductor device package of claim 1, wherein a first lateral distance between the bond pad of the second semiconductor device and another lateral side surface of the second semiconductor device is between about 10% and about 25% of a second lateral distance between the bond pad and a geometric center of the second semiconductor device.

10. The semiconductor device package of claim 1, wherein at least a portion of the first semiconductor device extends laterally beyond a periphery of the second semiconductor device on at least another lateral side of the second semiconductor device.

11. The semiconductor device package of claim 1, further comprising a die-attach film or a molded underfill interposed between the first semiconductor device and the second semiconductor device.

12. The semiconductor device package of claim 1, wherein the conductive pad of the substrate is connected to a routing member extending from a first major surface of the substrate to a second major surface on a side of the substrate opposite the first semiconductor device.

13. The semiconductor device package of claim 1, wherein a second lateral footprint of the second semiconductor device is smaller than a first lateral footprint of the first semiconductor device, as measured in a direction intersecting the at least one conductor and the at least another conductor.

14. The semiconductor device package of claim 13, wherein the second semiconductor device is at least substantially centered over the first semiconductor device.

15. The semiconductor device package of claim 1, wherein the semiconductor device package is at least substantially symmetrical across a plane bisecting the semiconductor device package between the at least one conductor and the at least another conductor.

16. The semiconductor device package of claim 1, wherein the at least one conductor extends from the conductive pad, in a direction away from the substrate along the lateral side surface of the first semiconductor device, in a direction toward a lateral center of the semiconductor device package along an inactive surface of the first semiconductor device, in a direction away from the first semiconductor device along another lateral side surface of the second semiconductor device, and in the direction toward the lateral center of the semiconductor device package along the active surface of the second semiconductor device.

17. A semiconductor device package, comprising:
a first semiconductor device over a substrate;
a second semiconductor device over the first semiconductor device, an active surface of the second semiconductor device facing away from the substrate;
at least one conductor extending from a bond pad of the second semiconductor device, along surfaces of the second semiconductor device, the first semiconductor device, and the substrate to a conductive pad of the substrate, the at least one conductor in contact with the bond pad and the conductive pad and a dielectric material interposed between the at least one conductor and the first semiconductor device and between the at least one conductor and the second semiconductor device, a lateral side surface of the first semiconductor device intersecting the conductive pad; and
an encapsulant distinct from the dielectric material extending over the at least one conductor, at least one surface of the second semiconductor device, and an upper surface of the substrate, the encapsulant covering a portion of the conductive pad proximate to a location where the at least one conductor and the dielectric material extend continuously and conformally over the lateral side surface of the first semiconductor device and wherein each of the encapsulant, the at least one conductor, and the dielectric material contact the conductive pad;
wherein the at least one conductor extends from the conductive pad, in a direction away from the substrate along the lateral side surface of the first semiconductor device, in a direction toward a lateral center of the semiconductor device package along an inactive surface of the first semiconductor device, in a direction away from the first semiconductor device along another lateral side surface of the second semiconductor device, and in the direction toward the lateral center of the semiconductor device package along the active surface of the second semiconductor device.

* * * * *

UNITED STATES PATENT AND TRADEMARK OFFICE
CERTIFICATE OF CORRECTION

PATENT NO. : 12,062,635 B2
APPLICATION NO. : 17/451693
DATED : August 13, 2024
INVENTOR(S) : Po Chih Yang et al.

It is certified that error appears in the above-identified patent and that said Letters Patent is hereby corrected as shown below:

In the Specification

| | | | |
|---|---|---|---|
| | Column 1, | Line 13, | change "No. 11,171,109 issued" to --No. 11,171,109, issued-- |

In the Claims

| | | | |
|---|---|---|---|
| Claim 1, | Column 14, | Line 52, | change "side surf ace of the" to --side surface of the-- |
| Claim 7, | Column 15, | Line 31, | change "lateral toot print of" to --lateral footprint of-- |

Signed and Sealed this
Seventeenth Day of September, 2024

Katherine Kelly Vidal
*Director of the United States Patent and Trademark Office*